United States Patent
Watanabe

(10) Patent No.: US 10,673,465 B2
(45) Date of Patent: Jun. 2, 2020

(54) MEMORY CONTROLLER, MEMORY SYSTEM, AND CONTROL METHOD

(71) Applicant: Toshiba Memory Corporation, Minato-ku (JP)

(72) Inventor: Daiki Watanabe, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 70 days.

(21) Appl. No.: 15/693,585

(22) Filed: Sep. 1, 2017

(65) Prior Publication Data

US 2018/0152207 A1 May 31, 2018

Related U.S. Application Data

(60) Provisional application No. 62/427,860, filed on Nov. 30, 2016.

(51) Int. Cl.
*H03M 13/39* (2006.01)
*G06F 11/10* (2006.01)
(Continued)

(52) U.S. Cl.
CPC ......... *H03M 13/39* (2013.01); *G06F 11/1012* (2013.01); *G06F 11/1068* (2013.01);
(Continued)

(58) Field of Classification Search
CPC .... H03M 13/39; H03M 13/00; H03M 13/152; H03M 13/1515; H03M 5/00;
(Continued)

(56) References Cited

U.S. PATENT DOCUMENTS 6,460,160 B1 * 10/2002 Classon .............. H03M 13/453
714/791
7,260,762 B2 * 8/2007 Desai ................ H03M 13/2963
714/755

(Continued)

OTHER PUBLICATIONS

David Chase "A Class of Algorithms for Decoding Block Codes with Channel Measurement Information", IEEE Transactions on Information Theory, vol. it-18, No. 1, 1972, 13 pages.
Ramesh Mahendra Pyndiah "Near-Optimum Decoding of Product Codes: Black Turbo Codes", IEEE Transactions on Communications, vol. 46, No. 8, 1998, 8 pages.

*Primary Examiner* — James C Kerveros
(74) *Attorney, Agent, or Firm* — Oblon, McClelland, Maier & Neustadt, L.L.P.

(57) ABSTRACT

A memory controller according to an embodiment includes a memory interface that reads out a received word from a non-volatile memory and a decoder that performs bounded distance decoding for the read received word. The decoder sets $r_m$ ($r_m$ is a natural number equal to or larger than 1) symbols of a plurality of symbols constituting the received word, as options of symbol positions at each of which an error is assumed, generates a test pattern in which m (m is a natural number equal to or larger than 1 and equal to or smaller than the $r_m$) symbols of the $r_m$ symbols are objects of rewriting, generates test hard-decision values by rewriting each of hard-decision values of the m symbols that are objects of rewriting in the test pattern, among the symbols, and performs bounded distance decoding for the test hard-decision values.

20 Claims, 8 Drawing Sheets

(51) Int. Cl.
  *H03M 13/15* (2006.01)
  *H03M 13/00* (2006.01)
  *H03M 13/45* (2006.01)
  *H03M 5/00* (2006.01)
  *G11C 29/52* (2006.01)
  *G11C 29/04* (2006.01)
  *G11C 29/10* (2006.01)

(52) U.S. Cl.
  CPC ......... *H03M 13/00* (2013.01); *H03M 13/152* (2013.01); *H03M 13/155* (2013.01); *H03M 13/1515* (2013.01); *H03M 13/453* (2013.01); *G11C 29/10* (2013.01); *G11C 29/52* (2013.01); *G11C 2029/0411* (2013.01); *H03M 5/00* (2013.01)

(58) Field of Classification Search
  CPC ........... H03M 13/453; H03M 13/2909; H03M 13/3784; H03M 13/458; H03M 13/155; G06F 11/1012; G06F 11/1068; G11C 2029/0411; G11C 29/10; G11C 29/52
  USPC ........................................................ 714/780
  See application file for complete search history.

(56) References Cited

U.S. PATENT DOCUMENTS

| | | | |
|---|---|---|---|
| 7,310,767 B2 * | 12/2007 | Desai ................ | H03M 13/2909 714/780 |
| 2004/0019842 A1 * | 1/2004 | Argon ................... | H03M 13/29 714/755 |
| 2006/0020869 A1 * | 1/2006 | Desai ................ | H03M 13/2909 714/752 |
| 2006/0020874 A1 * | 1/2006 | Desai ................ | H03M 13/2963 714/780 |
| 2008/0198953 A1 * | 8/2008 | Yokokawa ........ | H03M 13/1515 375/341 |
| 2013/0311847 A1 * | 11/2013 | Miyata ............... | H03M 13/1102 714/755 |
| 2015/0149873 A1 * | 5/2015 | Cai ..................... | H03N 13/458 714/773 |
| 2015/0333776 A1 * | 11/2015 | Bolotov ............. | H03M 13/458 714/780 |
| 2016/0182087 A1 * | 6/2016 | Sommer ............ | H03M 13/1148 714/752 |

* cited by examiner

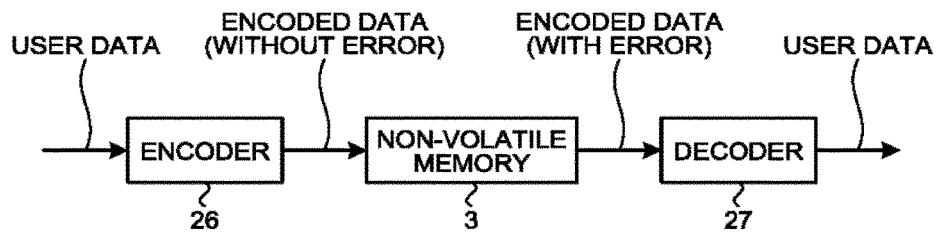

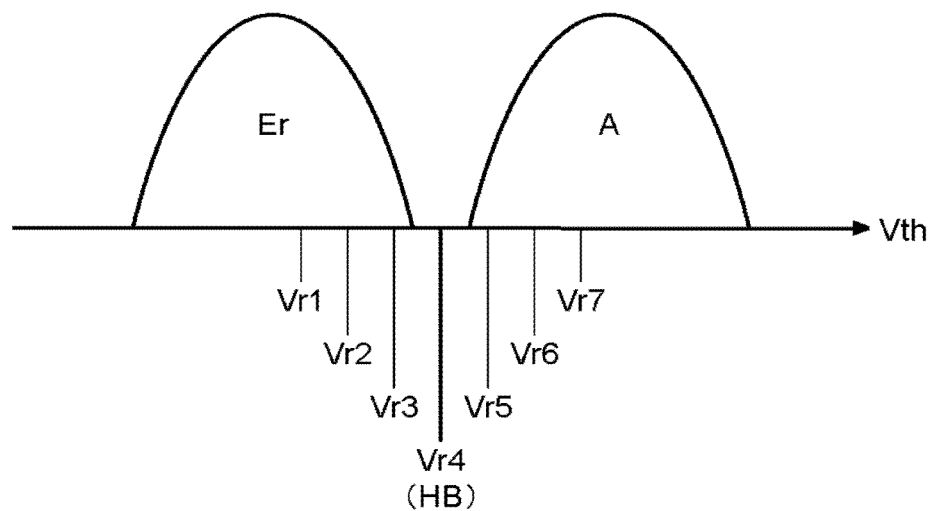

FIG.11

| | SYMBOL NUMBER | $S_0$ | $S_1$ | $S_2$ | $S_3$ | $S_4$ | $S_5$ | $S_6$ |
|---|---|---|---|---|---|---|---|---|
| m=1 | TEST PATTERN #1 | × | | | | NOT SE-LECTED | NOT SE-LECTED | NOT SE-LECTED |
| m=1 | TEST PATTERN #2 | | × | | | NOT SE-LECTED | NOT SE-LECTED | NOT SE-LECTED |
| m=1 | TEST PATTERN #3 | | | × | | NOT SE-LECTED | NOT SE-LECTED | NOT SE-LECTED |
| m=1 | TEST PATTERN #4 | | | | × | NOT SE-LECTED | NOT SE-LECTED | NOT SE-LECTED |
| m=2 | TEST PATTERN #5 | × | × | | NOT SE-LECTED | NOT SE-LECTED | NOT SE-LECTED | NOT SE-LECTED |
| m=2 | TEST PATTERN #6 | × | | × | NOT SE-LECTED | NOT SE-LECTED | NOT SE-LECTED | NOT SE-LECTED |
| m=2 | TEST PATTERN #7 | | × | × | NOT SE-LECTED | NOT SE-LECTED | NOT SE-LECTED | NOT SE-LECTED |
| m=3 | TEST PATTERN #8 | × | × | × | NOT SE-LECTED | NOT SE-LECTED | NOT SE-LECTED | NOT SE-LECTED |

FIG.12

| | $r_1$ | $r_2$ | $r_3$ | |
|---|---|---|---|---|
| ERROR DISTRIBUTION 1 | 40 | 25 | 13 | 41 |
| ERROR DISTRIBUTION 2 | 200 | 190 | 12 | 42 |
| ERROR DISTRIBUTION 3 | 400 | 15 | 10 | 43 |

| | SYMBOL NUMBER | $S_0$ | $S_1$ | $S_2$ | $S_3$ | $S_4$ | $S_5$ | $S_6$ |
|---|---|---|---|---|---|---|---|---|
| | CERTAINTY FACTOR | LOW | LOW | LOW | MIDDLE | HIGH | HIGH | HIGH |
| m=1 | TEST PATTERN #1 | × | | | | NOT SELECTED | NOT SELECTED | NOT SELECTED |
| m=1 | TEST PATTERN #2 | | × | | | NOT SELECTED | NOT SELECTED | NOT SELECTED |
| m=1 | TEST PATTERN #3 | | | × | | NOT SELECTED | NOT SELECTED | NOT SELECTED |
| m=1 | TEST PATTERN #4 | | | | × | NOT SELECTED | NOT SELECTED | NOT SELECTED |
| m=2 | TEST PATTERN #5 | × | × | | NOT SELECTED | NOT SELECTED | NOT SELECTED | NOT SELECTED |
| m=2 | TEST PATTERN #6 | × | | × | NOT SELECTED | NOT SELECTED | NOT SELECTED | NOT SELECTED |
| m=2 | TEST PATTERN #7 | | × | × | NOT SELECTED | NOT SELECTED | NOT SELECTED | NOT SELECTED |
| m=3 | TEST PATTERN #8 | × | × | × | NOT SELECTED | NOT SELECTED | NOT SELECTED | NOT SELECTED |

MEMORY CONTROLLER, MEMORY SYSTEM, AND CONTROL METHOD

CROSS-REFERENCE TO RELATED APPLICATIONS

This application is based upon and claims the benefit of priority from U.S. Provisional Application No. 62/427,860, filed on Nov. 30, 2016; the entire contents of which are incorporated herein by reference.

FIELD

Embodiments described herein relate generally to a memory controller, a memory system, and a control method.

BACKGROUND

Data that has been subjected to error correction coding is usually stored in a storage device in order to protect data to be stored. Therefore, when the data stored in the storage device is read out, decoding for the data that has been subjected to error correction coding is performed.

BRIEF DESCRIPTION OF THE DRAWINGS

FIG. 1 is a schematic diagram illustrating an example of a flow of a process according to an embodiment;

FIG. 2 is an explanatory diagram of a decoding process that employs chase decoding according to the embodiment;

FIG. 7 is an explanatory diagram of soft bit read according to the embodiment;

FIG. 8 is a diagram illustrating an example of an LLR table according to the embodiment;

FIG. 11 is a diagram illustrating an example of a list of test patterns generated by the test pattern generation process illustrated in FIG. 10;

FIG. 12 is a diagram illustrating an example of a determining table used in a method for determining the number of options of symbol positions at each of which an error is assumed in the embodiment;

FIG. 13 is a diagram illustrating an example of a determining table used in a method for determining an option of a combination of the number of hypothesis errors in the embodiment; and FIG. 14 is a diagram illustrating an example of a determining table used in another method for determining the number of options of symbol positions at each of which an error is assumed in the embodiment.

DETAILED DESCRIPTION

Figure 3:
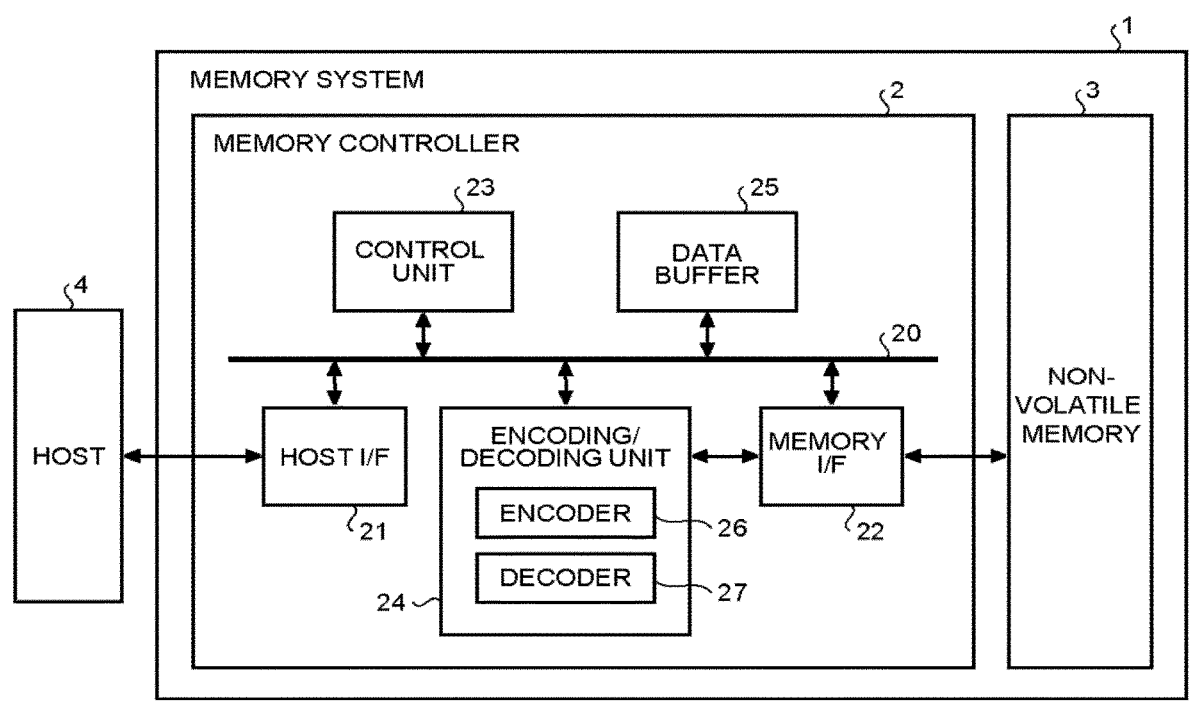
FIG. 3 is a block diagram illustrating an example of a schematic configuration of a memory system (a storage device) according to the embodiment.

A memory controller according to an embodiment exemplified below includes, for example, a memory interface that reads a received word from a non-volatile memory; and a decoder that performs bounded distance decoding for the read received word, wherein the decoder sets $r_m$ ($r_m$ is a natural number equal to or larger than 1) symbols among a plurality of symbols constituting the received word, as options of symbol positions at each of which an error is assumed, generates a plurality of test patterns as objects of rewriting m (m is a natural number equal to or larger than 1 and equal to or smaller than the $r_m$) symbols among the $r_m$ symbols, generates a plurality of test hard-decision values by rewriting hard-decision values of the m symbols that are objects of rewriting in each of the test patterns, and performs bounded distance decoding for each of the test hard-decision values.

Exemplary embodiments of a memory controller, a memory system, and a control method will be explained below in detail with reference to the accompanying drawings. The present invention is not limited to the following embodiments.

In recent years, a storage device that utilizes a non-volatile memory, such as a flash memory, is used for various purposes because of its high speed performance. However, in a storage device using a flash memory, for example, a read error can occur due to a noise generated in reading/writing, an elapsed time, and the like. Therefore, encoding using an error correcting code is usually performed for data to be recorded on the flash memory. When the data recorded on the flash memory is read out, a decoding process is performed for the read data, so that a bit error that has occurred is eliminated.

A storage device in which a high speed performance is emphasized is also required to perform an encoding/decoding process mounted thereon at a high speed. A BCH code, an RS code, and the like, which are algebraic codes, are known as an error correcting code that can achieve a high-speed encoding/decoding process. FIG. 1 is a schematic diagram illustrating an example of a flow of a process that protects data to be written/read (hereinafter, "user data") against an error by using these error correcting codes.

As illustrated in FIG. 1, user data input from an external device (hereinafter, "host"), such as a PC (personal computer), to a memory system is input to an encoder 26 inside the memory system and is encoded, and is then written to a non-volatile memory 3, such as a flash memory. The written user data that has been encoded at this time is called "transmission word". The transmission word is a code word of an error correcting code used in encoding, and is also called "encoded data". This encoded data is data before being written to the non-volatile memory 3 and therefore does not include an error in principle.

The encoded data recorded on the non-volatile memory 3 is read out as necessary. However, there is a possibility that this read encoded data includes an error. Therefore, the read encoded data is also called "received word", and is input to a decoder 27 and is subjected to error correction. The decoder 27 removes the error from the input encoded data to decode the input encoded data, and thereafter restores the user data that is original. Here, the decoded data is called "decoded word". The decoded word is a code word of the error correcting code used in encoding. An output destination of the restored user data may be the same as the host that is an input source of the user data or may be different from the host.

In a case where the encoded data read from the non-volatile memory 3 includes a certain number or more of errors, decoding with the error correcting code can fail. It is determined whether the decoding process is successful, depending on the quality of the read encoded data, the characteristics of the error correcting code used in the coding, the logs of the employed decoding process, and the like. For example, the BCH code or the RS code has a feature of being able to achieve a decoding technique referred to as "bounded distance decoding", which has a feature of being able to surely correct error symbols the number of which does not exceed a certain number, with a relatively small amount of calculation. In the following description, the number of error symbols that can be corrected by the bounded distance decoding is assumed to be t. This number t is also called "correctable number", and is a natural number determined depending on a code structure, an algorithm structure, and the like.

A code word of an error correcting code is usually a vector in which units of information, each called "symbol", are arranged. For example, a symbol of a binary BCH code is a bit (binary information of '0' or '1'), and a symbol of an RS code is an element of a finite field. Therefore, a code word of the binary BCH code is a bit string, for example, (0, 1, 1, 1, 0, 0, 1, 0). In a case of the binary BCH code, even when there is an error at a leading bit, for example, of a bit string obtained by reading the bit string exemplified above (0, 1, 1, 1, 0, 0, 1, 0) from the non-volatile memory 3, for example, that is, even when the read bit string is (1, 1, 1, 1, 0, 0, 1, 0), for example, it is possible to restore the original bit string (0, 1, 1, 1, 0, 0, 1, 0) by performing a decoding process, such as bounded distance decoding.

In a case where the bounded distance decoding is employed in the BCH code or the RS code, decoding is successful when the number of the error symbols is equal to or smaller than t, and correction fails when the number of the error symbols is larger than C. Therefore, when the number of the error symbols is larger than t, it is not possible to find a decoded word itself, or a wrong decoded word that is different from the transmission word is obtained.

Here, a case where using an error correcting code assuming a constituting symbol as a bit, each bit of encoded data has been recorded onto the non-volatile memory 3 as binary information of '0' or '1' is considered as an example in which the bonded distance coding fails. However, in the embodiment described below, the constituting symbol of the error correcting code is not limited to the bit, but can be an element of a finite field. Further, the bit recorded on the non-volatile memory 3 is not limited to the binary information, that is, binary data, but can be multi-value data.

In the following description, reading binary information that indicates whether the recorded bit is '0' or '1' during reading of data from the non-volatile memory 3 is called "hard-decision reading" (also called "hard bit read"), and the binary information read by the hard bit read is called "hard-decision value" (or "received hard-decision value"). On the other hand, reading probability information that the recorded bit is '0' and probability information that the recorded bit is '1' simultaneously is called "soft-decision reading" (also called "soft bit read"), and information including the probability information read by the soft bit read is called "soft-decision value". In the soft bit read, more information as compared with the hard bit read is read, and therefore the soft bit read has a feature that a probability of being able to correctly decoding data is high even in a case where relatively many errors are included in the read encoded data.

In addition, in the following description, the soft-decision value is represented in form of a log-likelihood ratio (LLR) more specifically. The LLR is information in which a probability that the recorded bit is '0' and a probability that the recorded bit is '1' are represented by a logarithmic ratio. This LLR becomes larger as the probability that the recorded bit is '0' is higher, and the LLR becomes smaller as the probability that the recorded bit is '1' is higher. Further, when the probability that the recorded bit is '0' and the probability that the recorded bit is '1' are equal to each other, the LLR is zero. Therefore, the absolute value of the LLR can be also handled as information that indicates "a certainty factor" regarding whether the recorded bit is '0' or '1'. In this case, it can be said that a bit having a higher certainty factor (that is, the absolute value of the LLR) is a bit having a lower error probability.

It is also possible to handle the hard-decision value read by the hard bit read as a kind of soft-decision value. Assuming that probabilities of occurrence of a read error from '0' to '1' and from '1' to '0' are both 1%, for example, it can be concluded that a probability that original written data is '0' is 99% when a result of the hard bit read is '0', and a probability that the original written data is '1' is 99% when the result of the hard bit read is '1'. Under this assumption, the LLR when '0' has been read out is about 4.6, and the LLR when the '1' has been read out is about −4.6. Consequently, the absolute value of the LLR is always the same. That is, the variation of the certainty factors is none.

The fact that it is possible to handle the hard-decision value as a kind of soft-decision value suggests that a soft-decision decoding technique for the soft-decision value that is described in the following embodiment can be also applied to the hard-decision value without requiring a special, additional process.

There is a technique referred to as "chase decoding", for example, as a decoding technique for data read by the soft bit read.

In the chase decoding, a decoded word is found by using a test pattern. Here, the test pattern is a hypothesis related to an error position in a received word.

FIGS. 2(a) to 2(f) are explanatory diagrams of a decoding process that employs chase decoding and, in particular, are explanatory diagrams of a role of a test pattern in the chase decoding.

In FIG. 2(a), received soft-decision information 201 is information (received word) read by soft bit read from the non-volatile memory 3. In this description, it is assumed that the received soft-decision information 201 is data obtained by writing encoded data, which has been encoded into a binary value of '0' or '1' by using a correctable number (2 in this description) of binary BCH codes, to the non-volatile memory 3 in advance and converting a result of reading of the written encoded data from the non-volatile memory 3 by the soft bit read, into an LLR form. In the example illustrated in FIG. 2(a), the encoded data is 7-bit binary data, an LLR of a symbol 2011 of this encoded data is '−1', an LLR of a symbol 2012 of this encoded data is '10', an LLR of a symbol 2013 is '−9', an LLR of a symbol 2014 is '−12', an LLR of a symbol 2015 is '8', an LLR of a symbol 2016 is '3', and an LLR of a symbol 2017 is '2'.

In the decoding process described by using FIGS. 2(a) to 2(f), hard decision is performed for the received soft-decision information 201 illustrated in FIG. 2(a), so that a received hard-decision value 202 illustrated in FIG. 2(b) is generated. That is, the received hard-decision value 202 is the original written data estimated from the received soft-decision information 201 (estimated encoded data).

A hard-decision process in the present embodiment is a process that estimates hard-decision information from soft-decision information. In a case where the LLR of the symbol 2011 is a negative value (−1) as illustrated in FIG. 2(a), for example, an original written value of the symbol 2011 is estimated to be '1' as illustrated in FIG. 2(b). On the other hand, in a case where the LLR of the symbol 2012 is a positive value as illustrated in FIG. 2(a), an original written value of the symbol 2012 is estimated to be '0' as illustrated in FIG. 2(b).

In FIG. 2(b), an error position present in the received hard-decision value 202 is hatched. That is, values of the symbols 2011, 2016, and 2017 do not match between the original written data including no error and the received hard-decision value 202.

As described above, when error symbols are included in the received hard-decision value 202, the number (3 in this description) of which is larger than the correctable number (2 in this description) of the code used in the coding (the binary BCH code in this description), bounded distance decoding of the BCH code whose correctable number is 2 cannot decode original information correctly.

Therefore, in the chase decoding, a decoding process is performed by using one or more test patterns. The test pattern is a hypothesis related to an error position in a received word as described above, and is therefore a hypothesis related to a symbol position at which an error is present in the received hard-decision value 202 in this description. For example, a test pattern 2031 illustrated in FIG. 2(c) is a hypothesis that an error is present at the symbol 2017. It can be said that this is a hypothesis having a high likelihood, because an absolute value of an LLR of the symbol 2017 is relatively low, that is, the symbol 2017 is a symbol having a relatively low certainty factor.

On the other hand, a test pattern 2032 illustrated in FIG. 2(d) is a hypothesis that an error is present in the symbol 2013. It can be said that this is a hypothesis having a low likelihood, because an absolute value of an LLR of the symbol 2013 is relatively high, that is, the symbol 2013 is a symbol having a relatively high certainty factor.

A likelihood for a test pattern (certainty of a hypothesis) is determined based on an LLR of a symbol, because the description is directed to an error correcting code in which a constituting symbol is a bit here. However, in a case of using an error correcting code in which a symbol can have a value other than '0' and '1', a manner of determining the likelihood of the test pattern (the certainty of the hypothesis) is not limited to the method based on the LLR of the symbol. For example, the likelihood for the test pattern may be determined based on "a ratio of 'a probability that a received hard-decision value is correct' and 'a probability that a value having the second highest likelihood after the received hard-decision value is correct'"]. Also, the likelihood of the test pattern may be determined based on "a ratio of 'the probability that the received hard-decision value is correct' and 'a probability that the received hard-decision value is wrong'", for example.

As described above, the likelihood for the test pattern used in the chase decoding (the certainty of the hypothesis) is determined based on the received soft-decision information 201. Although it is assumed that an error is present at one symbol in each of the test patterns 2031 and 2032 illustrated in FIGS. 2(c) and 2(d), it is also possible to use a test pattern in which it is assumed that an error is present at two or more symbols in the chase decoding in the embodiment described below.

In the chase decoding, after one or more test patterns are generated in the manner described above, a test hard-decision value is generated for a combination of the received hard-decision value 202 and the test pattern 2031 or 2032, and bounded distance decoding is performed for each of the generated test hard-decision values.

In generation of the test hard-decision value, a value of a symbol at which it is assumed that an error is present in each test pattern is rewritten, that is, is reversed (flipped). In a case where the test pattern 2031 in FIG. 2(c) is applied to the received hard-decision value 202 in FIG. 2(b), for example, the value of the symbol 2017 in the received hard-decision value 202 is flipped from '0' to '1'. As a result, a test hard-decision value 2041 illustrated in FIG. 2(e) is generated. In bounded distance decoding for the test hard-decision value 2041, correction is able to be successful, because the number of error symbols included in the test hard-decision value 2041 is 2.

Here, rewriting the value of the symbol is called "reversing (flipping)", because the description is directed to the error correcting code in which the constituting symbol is a bit. However, in a case of using an error correcting code in which a symbol can have a value other than '0' and '1', an operation of rewriting the value of the symbol is not limited to a reversing (flipping) operation. For example, an operation that rewrites a value of a symbol for which an error of a received hard-decision value is assumed, to "a value having the second highest likelihood after the received hard-decision value".

Meanwhile, in a case where the test pattern 2032 in FIG. 2(d) is applied to the received hard-decision value 202 in FIG. 2(b), the value of the symbol 2013 in the received hard-decision value 202 is reversed (flipped) from '1' to '0'. As a result, a test hard-decision value 2042 illustrated in FIG. 2(f) is generated. In bounded distance decoding for the test hard-decision value 2042, correction fails because the number of the error symbols included in the test hard-decision value 2042 is 4.

Because the description is directed to the error correcting code in which the constituting symbol is a bit here, rewriting of the test hard-decision value and the bounded distance decoding are performed once, respectively. On the other hand, in a case of using the error correcting code in which the symbol can have a value other than '0' and '1', rewriting of the test hard-decision value and the bounded distance decoding may be performed multiple times. For example, after a value of a symbol for which an error of a received hard-decision value is assumed is rewritten to "a value having the second highest likelihood after the received hard-decision value", the bounded distance decoding is performed, and thereafter the value of the symbol for which the error of the received hard-decision value is assumed is rewritten to "a value having the third highest likelihood after the received hard-decision value", then bounded distance decoding may be performed again.

Considering the above facts, in the chase decoding, it can be considered that it is possible to increase a probability of being able to perform decoding correctly by generating relatively likely test patterns as much as possible and repeating the bounded distance decoding.

Therefore, in the following embodiment, preferential generation of the relatively likely test pattern is enabled in the chase decoding that is used in soft-decision decoding of the error correcting code. For example, when a list of test patterns used in the chase decoding is configured, a range of options of a position of a symbol that is assumed as an error symbol is changed adaptively based on the characteristics of soft-decision information. This enables improvement of a correcting capability while suppressing a calculation amount.

FIG. 3 is a block diagram illustrating an example of a schematic configuration of a memory system (a storage device) that performs a decoding process using chase decoding according to the present embodiment. As illustrated in FIG. 3, a memory system 1 includes a memory controller 2 and the non-volatile memory 3. The memory system 1 can be connected to a host 4. FIG. 3 illustrates a state where the memory system 1 is connected to the host 4. The host 4 may be an electronic device, such as a personal computer and a mobile terminal, for example.

The non-volatile memory 3 is a non-volatile memory that stores therein data in a non-volatile manner, and is a NAND type flash memory (hereinafter, simply "NAND memory"), for example. The following description exemplifies a case of using the NAND memory as the non-volatile memory 3. However, a storage device other than the NAND memory, for example, a 3D structure flash memory, a ReRAM (Resistance Random Access Memory), and a FeRAM (Ferroelectric Random Access Memory) can be also used as the non-volatile memory 3. Further, it is not essential that the non-volatile memory 3 is a semiconductor memory. The present embodiment can be applied to various types of storage media other than the semiconductor memory.

The memory system 1 may be a memory card in which the memory controller 2 and the non-volatile memory 3 are configured as one package, for example, or may be an SSD (Solid State Drive), for example.

The memory controller 2 controls writing to the non-volatile memory 3 in accordance with a write command (request) from the host 4. Also, the memory controller 2 controls reading from the non-volatile memory 3 in accordance with a read command from the host 4. The memory controller 2 includes a host I/F (host interface) 21, a memory I/F (memory interface) 22, a control unit 23, an encoding/decoding unit (codec) 24, and a data buffer 25. The host I/F 21, the memory I/F 22, the control unit 23, the encoding/decoding unit 24, and the data buffer 25 are mutually connected via an internal bus 20.

The host I/F 21 performs a process in accordance with a standard of an interface with the host 4 to output a command received from the host 4, user data, and the like to the internal bus 20. The host I/F 21 also transmits user data read from the non-volatile memory 3, a response from the control unit 23, and the like to the host 4.

The memory I/F 22 performs a process of writing to the non-volatile memory 3 based on an instruction by the control unit 23. Also, the memory I/F 22 performs a process of reading from the non-volatile memory 3 based on an instruction by the control unit 23.

The control unit 23 integrally controls respective constituent elements of the memory system 1. When receiving a command from the host 4 via the host I/F 21, the control unit 23 executes control in accordance with that command. For example, the control unit 23 instructs the memory I/F 22 to write user data and parity to the non-volatile memory 3 in accordance with the command from the host 4. Also, the control unit 23 instructs the memory I/F 22 to read the user data and the parity from the non-volatile memory 3 in accordance with the command from the host 4.

When receiving the write request from the host 4, the control unit 23 determines a storing region (a memory region) on the non-volatile memory 3 with regard to user data accumulated in the data buffer 25. That is, the control unit 23 manages a writing destination of the user data. Correspondence between a logical address of the user data received from the host 4 and a physical address indicating the storing region on the non-volatile memory 3, in which that user data have been stored is stored as an address conversion table.

Further, when receiving the read request from the host 4, the control unit 23 converts a logical address specified by the read request to a physical address by using the above address conversion table, and instructs the memory I/F 22 to perform reading from that physical address.

In a NAND memory, writing and reading are usually performed on the basis of a data unit called "page", and deletion is usually performed on the basis of a data unit called "block". A plurality of memory cells connected to the same word line is called "memory cell group" in the present embodiment. In a case where the memory cell is a single-level cell (SLC), one memory cell group corresponds to one page. In a case where the memory cell is a multi-level cell (MLC), one memory cell group corresponds to a plurality of pages. Further, each memory cell is connected to a bit line in addition to a word line. Therefore, each memory cell can be identified by an address for identifying word lines and an address for identifying bit lines.

The data buffer 25 temporarily stores therein the user data that the memory controller 2 has received from the host 4, before the user data is stored in the non-volatile memory 3. Also, the data buffer 25 temporarily stores therein the user data read from the non-volatile memory 3 before the user data is transmitted to the host 4. A general-purpose memory, such as an SRAM (Static Random Access Memory) and a DRAM (Dynamic Random Access Memory), can be used as the data buffer 25.

The user data transmitted from the host 4 is transferred to the internal bus 20 and is then stored in the data buffer 25 temporarily. The encoding/decoding unit 24 encodes the user data stored in the non-volatile memory 3 to generate a code word. Also, the encoding/decoding unit 24 decodes a received word read from the non-volatile memory 3 to restore the user data. Therefore, the encoding/decoding unit 24 includes the encoder 26 and the decoder 27. Data encoded by the encoding/decoding unit 24 may include control data used inside the memory controller 2, for example, other than the user data.

Next, a write process in the present embodiment is described. The control unit 23 instructs the encoder 26 to encode user data when the user data is written to the non-volatile memory 3. At that time, the control unit 23 determines a storing location (a storing address) of a code word in the non-volatile memory 3 and also instructs the determined storing location to the memory I/F 22.

Figure 4:
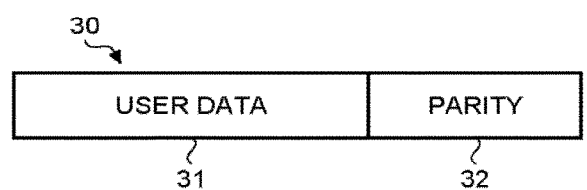
FIG. 4 is a diagram illustrating a configuration example of a code word generated by an encoder according to the embodiment.

The encoder 26 encodes user data on the data buffer 25 based on the instruction from the control unit 23 to generate a code word. An encoding method using a BCH (Bose-Chandhuri-Hocquenghem) code or an RS (Reed-Solomon) code can be employed as an encoding method, for example. FIG. 4 is a diagram illustrating a configuration example of the code word generated by the encoder 26. An example of a code word generated by encoding using the BCH code is illustrated in FIG. 4. A code word 30 is configured by user data 31 and parity 32, as illustrated in FIG. 4. The memory I/F 22 executes control that stores the code word 30 in the storing location on the non-volatile memory 3 instructed by the control unit 23.

Next, processing in reading from the non-volatile memory 3 in the present embodiment is described. In reading from the non-volatile memory 3, the control unit 23 instructs the memory I/F 22 to perform reading while specifying an address on the non-volatile memory 3. The control unit 23 also instructs the decoder 27 to start decoding. The memory I/F 22 reads a received word from the specified address of the non-volatile memory 3 in accordance with the instruction from the control unit 23 and inputs the read received word to the decoder 27. The decoder 27 decodes this received word read from the non-volatile memory 3.

Figure 5:
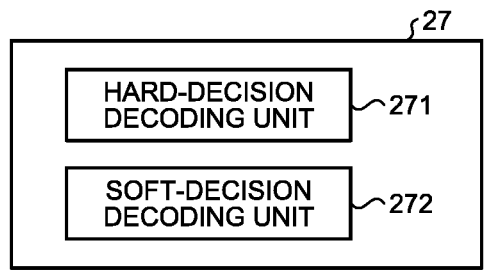
FIG. 5 is a diagram illustrating an example of a schematic configuration of a decoder according to the embodiment.

The decoder 27 decodes the received word read from the non-volatile memory 3. FIG. 5 is a diagram illustrating an example of a schematic configuration of the decoder 27. The decoder 27 includes a hard-decision decoding unit 271 that performs hard-decision decoding (hard-input hard-output) and a soft-decision decoding unit 272 that performs soft-decision decoding (soft-input soft-output). Hard-decision decoding is a decoding process that performs decoding by using a hard-decision value as an input and outputs the hard-decision value as a result of the decoding. Meanwhile, soft-decision decoding is a decoding process that performs decoding by using a soft-decision value as an input and outputs the soft-decision value as a result of the decoding.

Generally, soft-decision decoding has a feature that an error correcting capability is higher than that of hard-decision decoding but a processing time is long. Therefore, in the present embodiment, the decoder 27 is configured in such a manner that the hard-decision decoding unit 271 performs hard-decision decoding of the received word read as a hard-decision value from the non-volatile memory 3, thereafter a received word that cannot be decoded by hard-decision decoding is read as a soft-decision value, and the soft-decision decoding unit 272 then performs soft-decision decoding of the received word read as the soft-decision value. However, the configuration of the decoder 27 is not limited to this configuration, but can be modified in various ways, for example, into a configuration in which hard-decision decoding is omitted and soft-decision decoding is performed for all received words.

Figure 6:
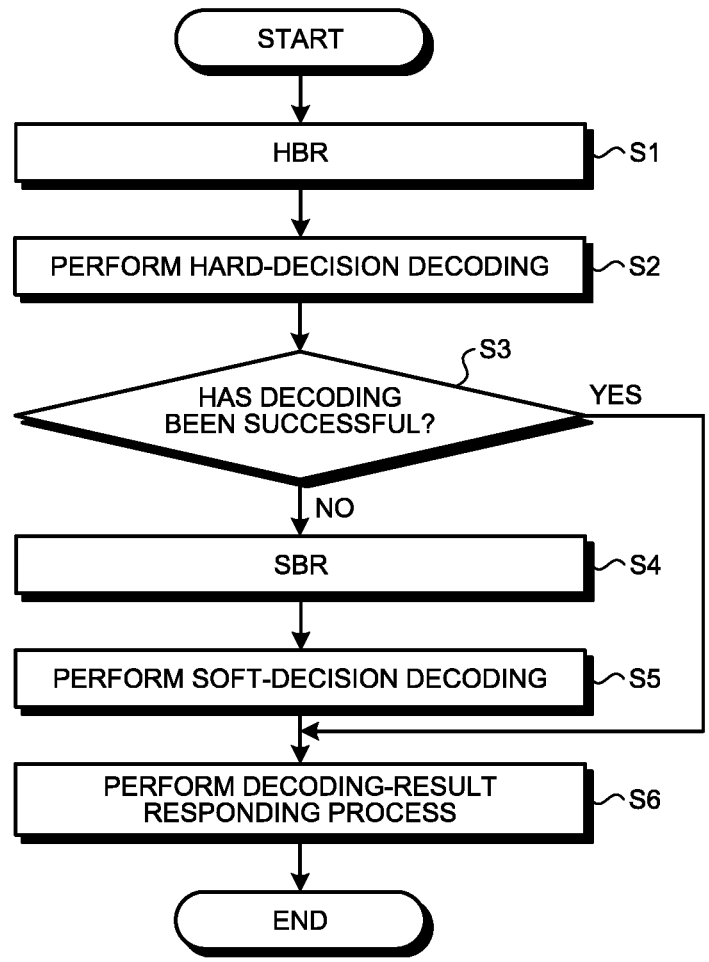
FIG. 6 is a flowchart illustrating an example of a schematic configuration of a read process according to the embodiment.

FIG. 6 is a flowchart illustrating an example of a schematic configuration of a read process according to the present embodiment. The control unit 23 instructs the memory I/F 22 to perform reading from the non-volatile memory 3 by hard bit read (HBR) while specifying an address of a read source. The memory I/F 22 performs the hard bit read for the specified address in response to the instruction from the control unit 23 (Step S1). The hard bit read is a reading method that reads each bit constituting a code word as a hard-decision value of '0' or '1'. A read received word (hard-decision value) is stored in the data buffer 25. Although an example in which the read received word (hard-decision value) is stored in the data buffer 25 is described here, a buffer for storing the received word (hard-decision value) may be provided in the decoder 27 so that the received word (hard-decision value) is stored in this buffer.

In a case where the non-volatile memory 3 is a NAND memory, when data is written, electrons are injected in accordance with a data value in such a manner that the number of electrons (a charge amount) of a floating gate corresponds to any of a plurality of distributions (threshold distributions). Here, an example of one bit/cell in which one memory cell stores one bit is described for simplifying the description. In a case of the one bit/cell, either one of two distributions corresponds to '0' and the other one corresponds to '1'. In a case where a voltage is applied to a memory cell, a current flows when a voltage having a voltage value equal to or larger than that corresponding to a charge amount of that memory cell is applied, and no current flows when a voltage less than that voltage is applied. Therefore, the voltage at the boundary level is determined for each memory cell, depending on a charge amount of the memory cell. Here, this voltage determined depending on the charge amount of the memory cell is called "threshold voltage (Vth)". In an initial state, electric charges are injected into the memory cell to correspond to either of two threshold-voltage distributions. In reading, it is determined whether data stored in this memory cell is '1' or '0', by applying a voltage that separates the two threshold-voltage distributions (hereinafter, "read level") to the memory cell.

The hard bit read is reading in which the non-volatile memory 3 applies a reference read level to a memory cell, determines whether data stored in the memory cell is '1' or '0', and outputs a result of determination. In this description, the read level used in the hard bit read is called "reference read level". In the hard bit read, a read level obtained by shifting a voltage from the reference read level may be used. Reading that uses this shifted read level is also called "shift read".

Returning to the description of FIG. 6, the control unit 23 instructs the decoder 27 to perform hard-decision decoding. The decoder 27 performs hard-decision decoding for the received word (hard-decision value) stored in the data buffer 25 (Step S2). Specifically, the hard-decision decoding unit 271 performs hard-decision decoding for the received word (hard-decision value) read from the data buffer 25.

In the hard-decision decoding, the hard-decision decoding unit 271 performs decoding, for example, bounded distance decoding, for the received word input as the hard-decision value. The hard-decision decoding performed by the hard-decision decoding unit 271 is not limited to bounded distance decoding and any hard-decision decoding can be used.

After Step S2, the hard-decision decoding unit 271 determines whether decoding of the received word has been successful, and notifies the control unit 23 of a result of this determination. The control unit 23 determines whether decoding of the received word has been successful based on the notification from the hard-decision decoding unit 271 (Step S3), and the read process is finished when decoding of the received word has been successful (YES at Step S3).

On the other hand, when decoding of the received word by the hard-decision decoding unit 271 has failed (NO at Step S3), the control unit 23 instructs the memory I/F 22 to perform reading from the non-volatile memory 3 by soft bit read (SBR) while specifying an address corresponding to that received word. In response to this instruction, the memory I/F 22 performs the soft bit read for the specified address (Step S4). The soft bit read is reading that reads out data stored in the non-volatile memory 3 as a soft-decision value (corresponding to an LLR).

In the present embodiment, the received word read by the soft bit read is constituted by a plurality of LLRs (also called "soft-decision values") respectively corresponding to a plurality of bits constituting encoded data to be written/read (see the reception soft-decision value 201 in FIG. 2(a)). Each of the bits constituting the encoded data is called "symbol". Therefore, the received word is constituted by a string of LLRs associated with the respective symbols. The symbols basically correspond to memory cells in the non-volatile memory 3 on a one-to-one basis.

The LLR in the present embodiment is defined as a value obtained by taking a logarithm of a ratio of a conditional probability $P(x=0|a)$ that a write bit x to each memory cell is logic '0' under a condition where a value of a threshold voltage of the non-volatile memory 3 is included in a range a and a conditional probability $P(x=1|a)$ that the write bit x to each memory cell is logic '1' under the condition where the value of the threshold voltage is included in the range a. When this relation is represented by an expression, the LLR is $\ln(P(x=0|a)/P(x=1|a))$, where ln is a natural logarithm.

FIG. 7 is an explanatory diagram of soft bit read. The horizontal axis in FIG. 7 represents a threshold voltage of a memory cell, and the vertical axis represents an appearance frequency. In FIG. 7, a single-level cell that stores one bit/cell is exemplified, and an Er (Erase) distribution on the left side corresponds to a data value of '1' while an A distribution on the right side corresponds to a data value of '0'. In the soft bit read, in addition to reading that uses a reference read level used in hard bit read, reading that uses one or more read levels set on each of both sides of the reference read level is performed. In FIG. 7, Vr4 (HB) represents the reference read level used in the hard bit read. Also, in the example illustrated in FIG. 7, read levels Vr1, Vr2, and Vr3 lower than the reference read level Vr4 and read levels Vr5, Vr6, and Vr7 higher than the reference read level Vr4 are set, other than the reference read level Vr4. Therefore, in the example illustrated in FIG. 7, soft bit read is performed by using seven read levels in total, which are the reference read level Vr4, the read levels Vr1 to Vr3 and the read levels Vr5 to Vr7 set so that three read levels are set in each side of the reference read level Vr4. The number of the read levels in the soft bit read is not limited to seven.

An LLR of each symbol in a received word can be obtained by using an LLR table based on a result of reading (a result of determination) whether a threshold voltage of each memory cell is equal to or higher than each read level. FIG. 8 is a diagram illustrating an example of the LLR table. As illustrated in FIG. 8, when it is determined that a threshold voltage of a memory cell is lower than the level Vr1, an LLR of a symbol corresponding to this memory cell is identified as '−9'. Further, when it is determined that a threshold voltage of a memory cell is higher than the level Vr1 and is lower than the level Vr2, an LLR of a symbol corresponding to this memory cell is identified as '−5'. FIG. 8 is only an example, and does not limit the configuration of the LLR table. It is also possible to obtain the LLR of each symbol by using a predetermined calculation expression in place of the LLR table. In the following description, an operation from performing the soft bit read to identifying the LLR is referred to as an operation that reads out data from the non-volatile memory 3 as a soft-decision value.

The operation obtaining the LLR based on the result of determination whether the threshold voltage of each memory cell is equal to or higher than each read level may be performed by the memory controller 2 or may be performed by the non-volatile memory 3. In a case where the memory controller 2 performs that operation, the non-volatile memory 3 outputs information that indicates in which one of eight regions the threshold voltage is present, the eight regions being regions lower than the level Vr1, equal to or higher than the level Vr1 and lower than the level Vr2, equal to or higher than the level Vr2 and lower than the level Vr3, equal to or higher than the level Vr3 and lower than the level Vr4, equal to or higher than the level Vr4 and lower than the level Vr5, equal to or higher than the level Vr5 and lower than the level Vr6, equal to or higher than the level Vr6 and lower than the level Vr7, and equal to or higher than the level Vr7. The memory I/F 22 then obtains the LLR based on the LLR table and the information output from the non-volatile memory 3, and outputs the obtained LLR to the decoder 27.

A case of a single-level cell having one bit/cell stored therein is described as an example in FIGS. 7 and 8. However, also in a case of a multi-level cell, reading is performed by using a plurality of read levels for each boundary of threshold distributions, as in the case of the single-level cell. The LLR is then identified based on a result of reading that uses the plurality of read levels.

Returning to the description of FIG. 6, the control unit 23 instructs the decoder 27 to perform soft-decision decoding. In response to this instruction, the decoder 27 performs the soft-decision decoding (Step S5).

Subsequently, the control unit 23 performs a decoding-result responding process that returns a result of the hard-decision decoding at Step S2 or the soft-decision decoding at Step S5 to the host 4 that has issued the read request (Step S6), and this read operation is finished.

By performing the processes described above, when error correction has been able to be achieved by the hard bit read and the hard-decision decoding, decoding is ended by performing this hard bit read and the hard-decision decoding. Therefore, it is possible to complete the read process in a short time. Meanwhile, error correction has not been able to be achieved by the hard bit read and the hard-decision decoding, the soft bit read and the soft-decision decoding that have a high correcting capability are performed and therefore error correction can be achieved more surely. Although a case where the hard bit read and the hard-decision decoding are performed first and, when an error has not been able to be corrected by hard bit read and the hard-decision decoding, the soft bit read and the soft-decision decoding are preformed is explained in this description, a decoding flow is not limited to this flow. For example, the decoding flow can be configured in such a manner that the soft bit read and the soft-decision decoding are performed directly, without performing the hard bit read and the hard-decision decoding. Alternatively, the decoding flow can be also configured in such a manner that the soft-decision decoding is performed for a hard-decision value read by the hard bit read. In this case, the soft-decision decoding is performed, regarding the read hard-decision value as a kind of a soft-decision value, as described above.

Figure 9:
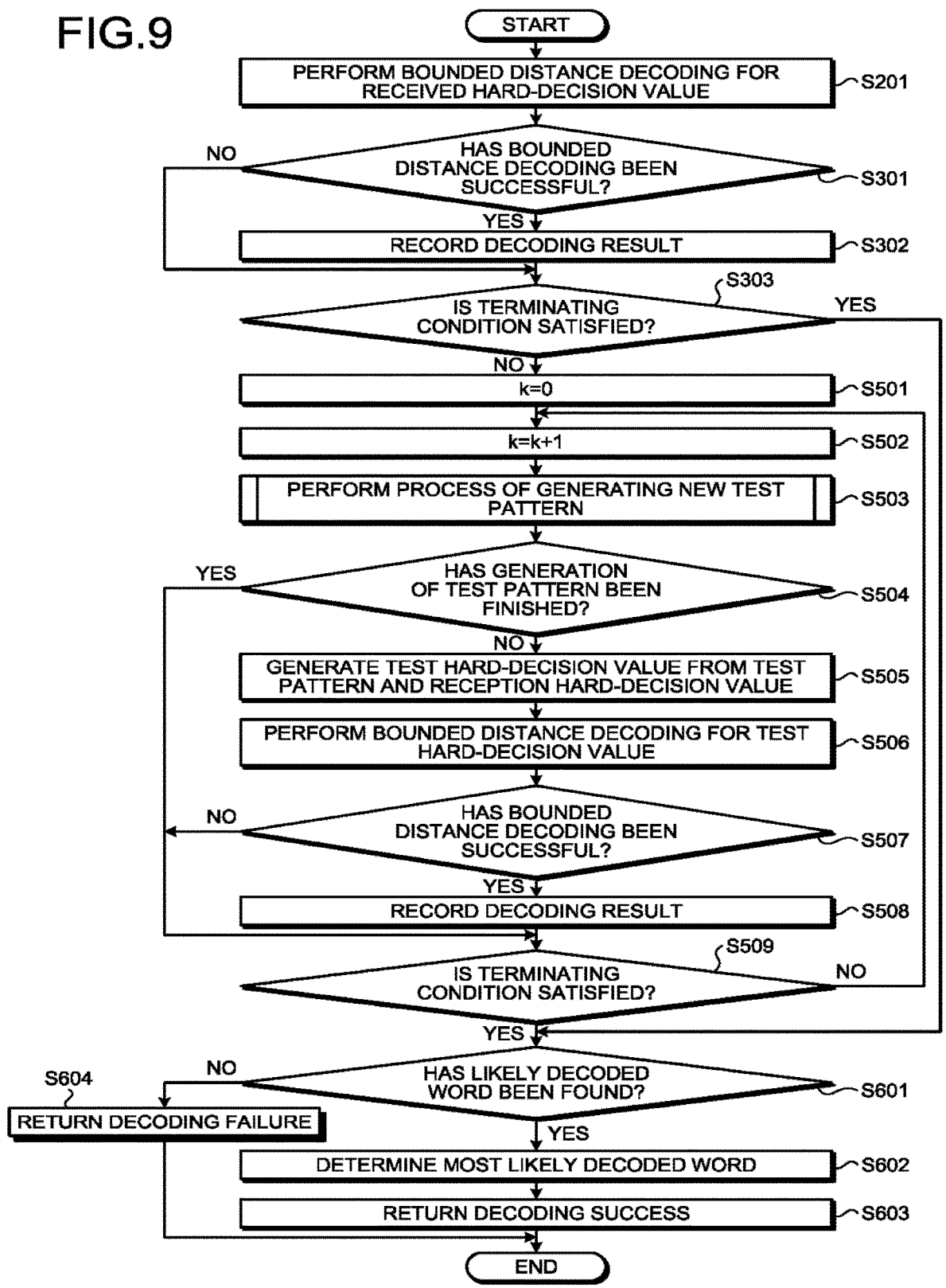
FIG. 9 is a flowchart illustrating a more detailed operation of chase decoding performed in the decoding process in the flowchart illustrated in FIG. 6.

FIG. 9 is a flowchart illustrating a more detailed operation of chase decoding performed in the decoding process in the flowchart illustrated in FIG. 6. The description referring to FIG. 9 focuses on an operation of the decoder 27 in the encoding/decoding unit 24 of the memory controller 2. Therefore, the hard bit read illustrated at Step S1 and the soft bit read illustrated at Step S4 in FIG. 6 are omitted in FIG. 9. Further, in FIG. 9, Step S201 corresponds to Step S2 in FIG. 6, Steps S301 to S303 correspond to Step S3 in FIG. 6, Steps S501 to S509 correspond to Step S5 in FIG. 6, and Steps S601 to S604 correspond to Step S6 in FIG. 6.

As illustrated in FIG. 9, in chase decoding performed in the decoding process according to the present embodiment, first the decoder 27 performs bounded distance decoding for a received word (received hard-decision value) read by the hard bit read illustrated at Step S1 in FIG. 6 by using the hard-decision decoding unit 271 (see FIG. 5) (Step S201). The decoder 27 then determines whether the bounded distance decoding at Step S201 has been successful (Step S301) and, when decoding has failed (NO at Step S301), the process proceeds to Step S303. Meanwhile, when the bounded distance decoding at Step S201 has been successful (YES at Step S301), the decoder 27 records a result of the bounded distance decoding in a predetermined storage region (for example, the data buffer 25) (Step S302), and the process proceeds to Step S303.

At Step S303, the decoder 27 determines whether a condition for ending the decoding process (also called "terminating condition") is satisfied and, when the condition is satisfied (YES at Step S303), the process proceeds to Step S601. Meanwhile, when the terminating condition is not satisfied (NO at Step S303), the process proceeds to Step S501 and the decoder 27 performs soft-decision decoding. The condition for ending the decoding process (terminating condition) is set to be a condition in which a sufficiently likely decoded word has been obtained, for example. By using such a condition, it is possible to end the decoding process in a short time when the number of errors included in the received word is small, for example, so that redundancy of a decoding-process time can be avoided.

In the soft-decision decoding according to the present embodiment, the decoder 27 resets a count value k (k=0) of a counter (not illustrated) (Step S501). Subsequently, the decoder 27 increments the counter by one (k=k+1) (Step S502) and performs a process that generates a new test pattern (Step S503). Details of this generation process are described later by using FIG. 10.

Figure 10:
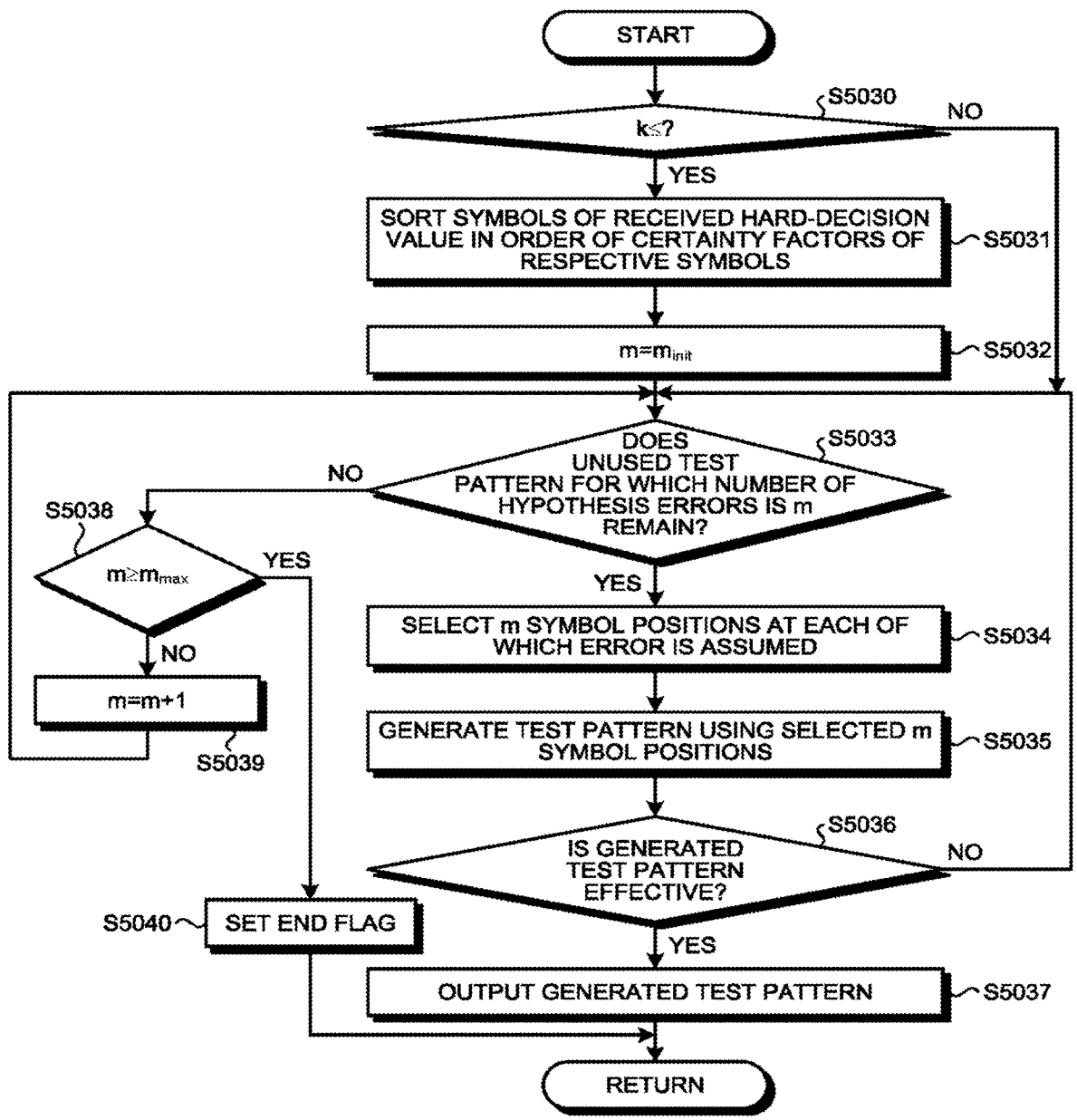
FIG. 10 is a flowchart illustrating an example of a test-pattern generation process according to the embodiment.

After completing the generation process at Step S503, the decoder 27 determines whether an end flag indicating that a new test pattern is not generated has been set (Step S504). When the end flag has been set (YES at Step S504), the process proceeds to Step S509. The end flag is referred to in more detail when FIG. 10 is described later.

Meanwhile, when the end flag has not been set and the new test pattern has been generated (NO at Step S504), the decoder 27 generates a new test hard-decision value from this new test pattern and a received hard-decision value of a received word read by the soft bit read illustrated at Step S4 in FIG. 6 (Step S505). Because reading using a reference read level used in the hard bit read is also performed in the soft bit read as described above, the received word read by the soft bit read also includes a received hard-decision value. However, the configuration is not limited thereto. The received hard-decision value 202 may be generated by performing hard decision for the received the soft-decision value 201 as described in the explanation of FIGS. 2(a) and 2(b), or the hard bit read for reading a received hard-decision value that is to be combined with a test pattern may be performed separately from the soft bit read illustrated at Step S4 in FIG. 6, or a test hard-decision value may be generated by combining the received hard-decision value read by the hard bit read illustrated at Step S1 in FIG. 6 and a test pattern with each other.

Subsequently, the decoder 27 performs bounded distance decoding for the generated test hard-decision value by means of the soft-decision decoding unit 272 (see FIG. 5) (Step S506). The decoder 27 then determines whether the bounded distance decoding at Step S506 has been successful (Step S507) and, when the decoding has failed (NO at Step S507), the process proceeds to Step S509. Meanwhile, when the bounded distance decoding at Step S506 has been successful (YES at Step S507), the decoder 27 records a result of the bounded distance decoding in a predetermined storage region (for example, the data buffer 25) (Step S508), and the process proceeds to Step S509.

At Step S509, the decoder 27 determines whether a condition for ending the decoding process (terminating condition) is satisfied as in Step S303 and, when the condition is satisfied (YES at Step S509), the process proceeds to Step S601. Meanwhile, when the terminating condition is not satisfied (NO at Step S509), the process returns to Step S502 and the decoder 27 performs subsequent processes, so that the decoder 27 performs the bounded distance decoding using another test pattern. The terminating condition can be set to be a condition in which a sufficiently likely decoded word has been obtained, or a condition in which the number of repetition times of the hard-decision decoding has reached a predetermined number, and also can be set to be a condition in which the tried number of test patterns has reached a predetermined number, or a condition in which the end flag indicating that generation of a new test pattern is not performed, that is, a condition in which a condition for not generating the new test pattern is satisfied, for example. By using such a condition, it is possible to avoid redundancy of the decoding process time, as in the case described above.

At Step S601, the decoder 27 determines whether the sufficiently likely decoded word has been obtained by the process described above. When the sufficiently likely decoded word has been obtained (YES at Step S601), the decoder 27 determines a decoded word having the highest likelihood among decoded words recorded in a predetermined storage region (for example, the data buffer 25) (Step S602), notifies the control unit 23 of this determined decoded word together with the fact that the decoding has been successful (Step S603), and ends this operation. Meanwhile, when the sufficiently likely decoded word has not been obtained (NO at Step S601), the decoder 27 notifies the control unit 23, for example, of the fact that the decoding has failed (Step S603), and ends this operation.

In the present embodiment, the decoder 27 is set to notify the control unit 23 of only the decoded word having the highest likelihood among the obtained decoded words. However, the process by the decoder 27 is not limited thereto. For example, the decoder 27 can be set to notify the control unit 23 of all the obtained decoded words. In this case, a configuration may be employed in which the control unit 23 identifies the decoded word having the highest likelihood among the notified decoded words, and user data restored from this identified decoded word is transmitted to the host 4. Further, the decoder 27 can be set to notify the control unit 23 of a soft-decision value for each symbol calculated from the obtained decoded words, that is, a soft-decision output value. In this case, a configuration may be employed in which further soft-decision decoding that uses the soft-decision output value notified by the decoder 27 as one of inputs is performed in the control unit 23, and the user data restored from the decoded word obtained by the further soft-decision decoding is transmitted to the host 4.

An example of a decoding technique that uses the decoder 27 as a portion of a larger decoder (a decoder configured to include the control unit 23 and the decoder 27 in this example) in this manner is block turbo decoding. An example of a process in the block turbo decoding is described below. For example, the decoder 27 performs soft-decision decoding for a soft-decision value read from the non-volatile memory 3 and notifies the control unit 23 of a soft-decision output value A as an output.

Subsequently, the control unit 23 inputs the soft-decision value that has been read from the non-volatile memory 3 and the soft-decision output value A obtained from the decoder 27 to another decoder X. The decoder X performs soft-decision decoding for the input soft-decision value and the obtained soft-decision output value A and notifies the control unit 23 of an obtained soft-decision output value B as its output. The control unit 23 inputs the soft-decision value that has been read from the non-volatile memory 3 and the soft-decision output value B obtained from the decoder X to the decoder 27. The decoder 27 performs decoding for the input soft-decision value and the soft-decision output value B and notifies the control unit 23 of the most likely decoded word among obtained decoded words, as its output. The control unit 23 restores user data from the most likely decoded word obtained in this manner, and transmits the user data to the host 4. However, the decoding technique to be used is not limited to the example of the block turbo decoding described above. It is possible to use various decoding techniques that use the decoder 27 as a portion of a larger decoder.

Probability information obtained by soft bit read, for example, can be used for determining whether the decoded word is likely at Step S601. Specifically, the likelihood of the decoded word can be determined by using the sum of absolute values of LLRs for symbols that are different in values between the received hard-decision value and the decoded word, for example.

For example, a correct decoded word obtained by applying the bounded distance decoding to the test hard-decision value 2041 exemplified in FIG. 2 is different from the received hard-decision value 202 in the symbols 2011, 2016, and 2017. In this case, the sum of absolute values of LLRs of the symbols 2011, 2016, and 2017 is 6 (=1+3+2).

The fact that the sum of the absolute values of the LLRs, which is obtained in this manner, is small means that the decoded word suggests the presence of an error in a symbol having a low certainty factor. From this fact, it can be said that as the sum of the absolute values of the LLRs for the symbols that are different in values between the received hard-decision value and the decoded word becomes smaller, the decoded word is more likely. Therefore, in the present embodiment, when the sum of the absolute values of the LLRs of the symbols that are different in values between the received word (received hard-decision value) and the decoded word is equal to or smaller than a predetermined threshold, that received word is determined to be likely.

In a case where a plurality of decoded words have been recorded as decoding results at Step S302 and/or Step S508 in FIG. 9, it is necessary to determine the most likely decoded word among the plural decoded words at Step S602. Also in this determination of the likelihood, it is possible to use the probability information obtained by the soft bit read. For example, in a case where the plural decoded words have been recorded as the decoding results, it is possible to determine a decoded word having the smallest sum of the absolute values of the LLRs for the symbols that are different in values between the received hard-decision value and the decoded word, as the most likely decoded word.

In a case of employing the chase decoding technique explained in the above description by using FIG. 9, it is effective to increase a likelihood of a test pattern in order to increase a decoding capability while suppressing a calculation amount. The likelihood of the test pattern is higher as the sum of absolute values of LLRs for symbols assumed as error positions is smaller, similarly to the decoded word. Therefore, it suffices that symbols having the sum of absolute values of LLRs, which is as small as possible, are assumed as the error positions in order to make the likelihood of the test pattern as high as possible.

Further, by performing the bounded distance decoding using a more likely test pattern in an earlier stage, it is possible to determine termination at an earlier time at Step S509 in FIG. 9. Therefore, it is possible to reduce the time required for the decoding process.

Next, the process of generating a test pattern for the chase decoding, illustrated at Step S503 in FIG. 9, is described in detail by using the drawings. FIG. 10 is a flowchart illustrating an example of the test-pattern generation process according to the present embodiment.

As illustrated in FIG. 10, the decoder 27 determines whether the count value k of a counter is 1 or less, that is, whether current generation of a test pattern is the first generation (Step S5030). When the current generation of the test pattern is the first generation (YES at Step S5030), the decoder 27 performs an initializing process. Meanwhile, when the current generation is the second generation of the test pattern or the subsequent generation (NO at Step S5030), the decoder 27 skips the initializing process and the process proceeds to Step S5033.

In the initializing process, the decoder 27 sorts symbols of a received hard-decision value in an order from smallest certainty factors thereof (Step S5031). An absolute value of an LLR can be used as the certainty factor, as described above. In this case, in the example illustrated in FIG. 2, the symbols 2011 to 2017 of the received hard-decision value 202 are sorted based on absolute values of their LLRs, so that the symbols 2011, 2017, 2016, 2015, 2013, 2012, and 2014 are arranged in that order. In this sort process, it is possible to use various sort algorithms, for example, an exact sort algorithm in which the absolute values of the LLRs are exactly arranged in an ascending order or an approximation sort algorithm in which a probability that a symbol having a smaller absolute value of an LLR is arranged at a position closer to the top of a list is designed to be higher.

In the following description, an i-th symbol number in a sorted symbol arrangement is assumed to be $S_i$. In that case, when it is assumed that the exact sort algorithm is used at Step S5031, $S_0$ is a symbol number of a symbol having the lowest certainty factor (a minimum least reliable symbol), and $S_1$ is a symbol number of a symbol having the second lowest certainty factor (a second minimum least reliable symbol).

Subsequently, the decoder 27 sets the number of symbols assumed as error positions in a test pattern (hereinafter, "the number of hypothesis errors") m to an initial value $m_{init}$ (Step S5302), and the process proceeds to Step S5033. Here, the initial value of m is $m_{init}=1$ typically. However, it is also possible to dynamically set the initial value $m_{init}$ based on the decoding result of the bounded distance decoding recorded at Step S302 in FIG. 9, for example. In bounded distance decoding using a binary BCH code, for example, when the number of errors included in a received hard-decision value is determined to be e based on the decoding result recorded at Step S302, the initial value $m_{init}$ can be set as $m_{init}=(t+1-e)$. In this case, an unnecessary test pattern can be removed. As described above, t is the number of error symbols correctable by the bounded distance decoding.

At Step S5033, it is checked whether an unused test pattern in which the number of hypothesis errors is m remains. The "unused" means that the test pattern has not been used for generation of a test hard-decision value for the purpose of the bounded distance decoding. Generally, when the number of options of symbol positions at each of which an error is assumed is assumed to be $r_m$, the number of variations of test patterns in which error positions are respectively assumed for m symbols of $r_m$ symbol options is $$\binom{r_m}{m}.$$

Therefore, when the $$\binom{r_m}{m}$$

test patterns have been already generated by repeatedly performing Step S5035 described later, a result of determination at Step S5033 is that the unused test pattern in which the number of hypothesis errors is m does not remain (NO at Step S5033). Meanwhile, when the number of the test pattern already generated is less than $$\binom{r_m}{m},$$

the result of the determination at Step S5033 is that the unused test pattern in which the number of hypothesis errors is m remains (YES at Step S5033).

In a case where the number of hypothesis errors m is a relatively larger value, when the number of options $r_m$ is set to be a large value, the number of variations of the test pattern $$\binom{r_m}{m}$$

becomes very large and therefore a large amount of processing time is required for processing all the test patterns. Therefore, in the present embodiment, the values m and $r_m$ are set in such a manner that the value of $r_m$ becomes smaller as the value of m becomes larger.

As a result of the determination at Step S5033, when the unused test pattern in which the number of hypothesis errors is m does not remain (NO at Step S5033), the decoder 27 determines whether the number of hypothesis errors m has reached an upper limit $m_{max}$ of the number of hypothesis errors, which has been set in advance (Step S5038). As a result of this determination, when the number of hypothesis errors m has not reached the upper limit $m_{max}$ (NO at Step S5038), the decoder 27 increments the number of hypothesis errors m by 1 (Step S5039), and thereafter the process returns to Step S5033. Meanwhile, when the number of hypothesis errors m has reached the upper limit $m_{max}$ (YES at Step S5038), the decoder 27 sets an end flag indicating that no new test pattern is generated (Step S5040), and thereafter the process returns to the operation illustrated in FIG. 9. At Step S504 in FIG. 9, it is determined whether generation of the test pattern has been finished based on this end flag.

However, there is the number of hypothesis errors m for which there is no effective test pattern, depending on a state of a received word (received hard-decision value) and selection of a linear code, for example. In this case, it suffices that a configuration is employed in which the value m for which there is no effective test pattern is skipped substantially.

For example, in an extended Hamming code, it is known that the number of bits '1' in a code word is always an even number. In addition, the number of correctable bits of bounded distance decoding for the extended Hamming code is one. Therefore, in a case where a received word originally includes an even number of '1', it is impossible to obtain an appropriate decoded word by the bounded distance decoding in which the number of correctable bits is one, when m is set to 2. This is because, when one bit is corrected by the bounded distance decoding, the number of bits '1' included in the decoded word, which is supposed to be an even number, becomes an odd number.

In a case where an ineffective value of m is known in advance, a configuration can be employed in which the value of m for which there is no effective test pattern is substantially skipped by setting the number of effective test patterns when the number of hypothesis errors m is an ineffective value of m, to zero. Consequently, it is possible to exclude the unnecessary test pattern and efficiently perform chase decoding.

The present embodiment is not limited to the extended Hamming code, but can be widely applied to a binary linear code in which the number of bits taking a value '1' in a code word is limited to an even number. Therefore, also in a case of using such a binary linear code, a configuration can be employed in which the number of m for which there is no effective test pattern is skipped substantially. In other words, in a case of using the binary linear code for which the number of bit values of '1' present in a code word is always an even number, a configuration may be employed in which a decode processing operation including generation of a test pattern (for example, Step S503 to S509 in FIG. 9) is performed for the number m that satisfies a condition that a value obtained by a modulo operation (also called "modulo") using the number m as a divided number and 2 as a dividing number (m mod 2) and a value obtained by a modulo operation using the number obtained by adding the number of error symbols t correctable by bounded distance decoding to the number of bit values of '1' present in the received hard-decision value 202 as a divided number and using 2 as a dividing number match each other, while the decode processing operation is substantially skipped for the number m that does not satisfy the above condition. A Reed Muller codes, a liner cyclic code having '1' as a root of a generating polynomial, which includes an extended BCH code, for example, are widely known as a code that satisfies such a condition.

As a result of the determination at Step S5033, when the unused test pattern for which the number of hypothesis errors is m (YES at Step S5033), the decoder 27 generates a new test pattern that is effective and unused, for which the number of hypothesis errors is m. Specifically, the decoder 27 selects m symbol positions at each of which an error is assumed (Step S5034). In this selection, the decoder 27 selects the m symbol positions at each of which the error is assumed so as not to overlap a used test pattern, more specifically, not to overlap a pattern of error positions in the used test pattern.

Also, at Step S5034, the decoder 27 selects the m symbol positions at each of which the error is assumed in such a manner that the sum of absolute values of LLRs of the selected symbols becomes small. In order to make the sum of the absolute values of the LLRs of the selected symbols relatively smaller, it suffices to select a symbol position closer to a top ($S_0$) in a symbol order after the symbols are sorted, as an error position. Therefore, in the present embodiment, the decoder 27 selects the m symbol positions at each of which the error is assumed, from a range of $r_m$ symbols from $S_0$ to $S_{r_m-1}$. Details of this selection are described later by using FIG. 11.

Subsequently, the decoder 27 generates a test pattern by using the m symbol positions selected at Step S5034 (Step S5035), and then determines whether the generated test pattern is effective (at Step S5036).

It can be determined whether the generated test pattern is effective, based on a likelihood of the test pattern, for example. It is possible to evaluate the likelihood of the test pattern by using the sum of absolute values of LLRs of symbols that are objects of rewriting, that is, the symbols selected as the error positions. For example, a configuration can be employed in which the likelihood of the generated test pattern is determined to be low in a case where this sum of the absolute values of the LLRs exceeds a predetermined threshold. In this case, it is determined that this generated pattern is ineffective at Step S5036. By excluding the ineffective test pattern before the bounded distance decoding is performed (Step S506 in FIG. 9) in this manner, the unnecessary test pattern is excluded in advance. Therefore, it is possible to perform chase decoding efficiently.

When the generated test pattern is determined to be ineffective (NO at Step S5036), the process returns to Step S5033. Meanwhile, when the generated test pattern is determined to be effective (YES at Step S5036), the decoder 27 employs the generated test pattern (Step S5037) and the process returns to the operation illustrated in FIG. 9.

Next, an operation when m symbol positions at each of which an error is assumed is selected from a range of $r_m$ symbols having symbol numbers from $S_0$ to $S_{rm-1}$ is described by using FIG. 11. FIG. 11 is a diagram illustrating an example of a list of test patterns generated by the test pattern generation process illustrated in FIG. 10. In FIG. 11, a test pattern illustrated on an upper side is a test pattern generated earlier in the operations illustrated in FIGS. 9 and 10. Therefore, it can be considered that the test pattern illustrated on the upper side is a more likely test pattern.

FIG. 11 exemplifies a case where m=1,2,3, $r_1$=4, and $r_2$=$r_3$=3. As illustrated in FIG. 11, test patterns #1 to #4 are test patterns for m=1. In a case of m=1, $r_1$=4 and therefore symbol positions $S_4$ to $S_6$ are excluded from options of error position in the test patterns for m=1 (not selected).

Test patterns #5 to #7 are test patterns for m=2. In a case of m=2, $r_2$=3 and therefore symbol positions $S_3$ to $S_6$ are removed from the options of error position (not selected). Also in the case of m=2, a symbol for which an absolute value of an LLR is relatively small is assumed as an error position in order to make the sum of absolute value of LLRs of symbols assumed as error positions smaller, as in the case of m=1.

A test pattern #8 is a test pattern for m=3. In a case of m=3, $r_3$=3 and therefore a test pattern for m=3 is one.

As described above, it is necessary to assume the symbol for which the absolute value of the LLR is relatively small as the error position in order to make the sum of the absolute values of the LLRs of the symbols assumed as the error positions smaller. Therefore, the present embodiment exemplifies generation of a test pattern in accordance with the following three rules. However, the following rules are only an example, and can be modified in various ways. Further, in the following description, it is assumed that a test pattern whose test pattern number for ordering test patterns is smaller is a more likely test pattern.

First, a test pattern number of a test pattern in which the number of symbols assumed as error positions (the number of hypothesis errors m) is small is set to be a small number.

Second, a suffix of the k-th smallest symbol of assumed error positions in a test pattern a is assumed as $\sigma_k(a)$, and when two mutually different test patterns a and b are ordered, values of the smallest suffixes $\sigma_1(a)$ and $\sigma_1(b)$ in the respective test patterns are compared with each other, and a smaller test pattern number is set for a test pattern having a smaller one of the smallest suffixes $\sigma_1(a)$ and $\sigma_1(b)$.

Third, in a case where suffix values from the first suffix values $\sigma_1(a)$ and $\sigma_1(b)$ to i-th (i is an integer equal to or larger than 1) suffix values $\sigma_i(a)$ and $\sigma_i(b)$ are equal, then (i+1)-th suffix values $\sigma_{i+1}(a)$ and $\sigma_{i+1}(b)$ are compared with each other, and the smaller test pattern number is set for a test pattern having a smaller one of the suffix values $\sigma_{i+1}(a)$ and $\sigma_{i+1}(b)$.

The above rules are described by way of a specific example. For example, in the test patterns #5 and #7 in FIG. 11, a symbol that provides the smallest suffix in the test pattern #5 is $S_0$ and therefore $\sigma_1(\#5)$=0. Meanwhile, in the test pattern #7, a symbol that provides the smallest suffix in the test pattern #7 is $S_1$ and therefore $\sigma_1(\#7)$=1. In this case, because of $\sigma_1(\#5)<\sigma_1(\#7)$, there is a high possibility that a likelihood of the test pattern #5 is higher than a likelihood of the test pattern #7. Therefore, in order to make the test pattern #5 appear prior to the test pattern #7 so that the test pattern #5 is used in bounded distance decoding with a priority, a smaller test pattern number '5' (<7), which is smaller than that assigned to the test pattern #7, is set to the test pattern #5 in accordance with the second rule.

Similarly, the test patterns #5 and #6 in FIG. 11 are also described. Because a symbol that provides the smallest suffix in the test pattern #6 is $S_0$, $\sigma_1(\#6)$=0. Therefore, due to $\sigma_1(\#5)$=$\sigma_1(\#6)$, the test patterns #5 and #6 cannot be ordered based on the smallest suffixes. Accordingly, the second smallest suffixes $\sigma_2(\#5)$ and $\sigma_2(\#6)$ in the test patterns #5 and #6 are compared with each other. As a result, because of $\sigma_2(\#5)$=1<$\sigma_2(\#6)$=2, there is a high possibility that the likelihood of the test pattern #5 is higher than a likelihood of the test pattern #6. Therefore, in order to make the test pattern #5 appear prior to the test pattern #6 so that the test pattern #5 is used in the bounded distance decoding with a priority, the smaller test pattern number '5' (<6), which is smaller than that assigned to the test pattern #6, is set for the test pattern #5 in accordance with the third rule.

The test patterns ordered based on the above rules can be generated by a relatively simple algorithm. Further, by ordering the test patterns based on the above rules, a more likely test pattern has a smaller test pattern number set therefor. Therefore, it is possible to obtain a desirable tendency that a likely test pattern appears in an early stage in a decoding process. Furthermore, a test pattern generating method based on the above rules also has an advantage that this method can be implemented relatively easily and it is possible to easily adjust the number of test patterns and a decoding capability by adjusting the parameters $r_m$ and m.

Next, a method of determining the number of options $r_m$ of a symbol position at which an error is assumed is described. FIG. 12 is a diagram illustrating an example of a determining table used in a method for determining the number of options $r_m$ in the present invention.

In a decoding process according to the present embodiment, when a test pattern is generated in accordance with the operation illustrated in FIG. 11, the number of options $r_m$ is determined by using the characteristics of an error distribution in a received hard-decision value and the determining table illustrated in FIG. 12, for example.

In FIG. 12, a parameter set 41 associated with an error distribution 1 is a combination of the numbers of options $r_m$ used in a case where the variation of absolute values of LLRs among symbols is relatively large. In a case where the variation of the absolute values of the LLRs among the symbols is relatively large, that is, symbols each having a high certainty factor and symbols each having a low certainty factor are separated from each other relatively clearly, it is considered to be appropriate to configure a test pattern under an assumption that there are many errors in the symbols each having the low certainty factor. Therefore, with respect to the error distribution 1, $r_1$ is set to be a relatively small number and $r_2$ and $r_3$ are set to be relatively larger numbers. With this setting, it is possible to expect that a high decoding capability can be obtained.

Further, a parameter set 43 associated with an error distribution 3 is a combination of the numbers of options $r_m$ used in a case where the variation of the absolute values of the LLRs among the symbols is relatively small. With respect to the error distribution 3, $r_2$ is set to be a relatively large number and $r_3$ is set to be a relatively small number, contrary to the error distribution 1. This is because possibilities of occurrence of an error are approximately the same among all the symbols when the variation of certainty factors is small, and therefore it is considered to be desirable to set more symbol positions as options of error positions.

Furthermore, a parameter set 42 associated with an error distribution 2 is a combination of the numbers of options $r_m$ used in a case where the variation of the absolute values of the LLRs among the symbols is at a medium level, that is, an intermediate level between a degree of the variation in the error distribution 1 and that in the error distribution 3. Therefore, $r_1$, $r_2$, and $r_3$ are all set to be the medium-level numbers in the parameter set 42.

For any of the parameter sets 41 to 43 exemplified in FIG. 12, the value of each of the numbers of options $r_m$ is set in such a manner that the total number of test patterns generated in the decoding process illustrated in FIG. 9 (hereinafter, "the total number of test patterns") does not exceed a certain value (for example, about 600). As the total number of test patterns is larger, a time required for processing of chase decoding increases. Therefore, by using the combination of the numbers of options $r_m$ optimized for object error distributions (the parameter sets 41 to 43) in a switching manner in accordance with the type of the error distribution while making the total number of test patterns not exceed the certain value, it is possible to perform error correction for various types of error patterns efficiently without increasing a calculation amount.

However, the number of about 600 with regard to the total number of test patterns exemplified in the above description is only an example. It is possible to freely set the approximate upper limit of the total number of test patterns, based on the characteristics of an error correcting code to be used, a restriction of a total processing time, a target value of an error correcting capability, and the like.

Further, it may be selected by a user in an arbitrary manner which one of the parameter sets 41 to 43 exemplified in FIG. 12 is used, or may be dynamically selected at a time of decoding. For example, in a case where a user has already known that data to be decoded (received word) is data read from a flash memory in a state where the variation of absolute values of LLRs is relatively large, the user may set a parameter set to be used in the decoder 27 through a register or the like in such a manner that decoding is performed by using the parameter set 41 for the error distribution 1.

A degree of the variation of the absolute values of the LLRs of the data to be decoded (received word), that is, a degree of variation of certainty factors can be estimated based on various types of information having a correlation with the variation of the absolute values of the LLRs, as listed below.

1. Environment information, such an elapsed time from turning on a power of a flash memory chip that is an object of reading, a temperature around the flash memory chip
2. Stress information, such as the number of rewriting cycles in a region (block) in which data to be read is recorded, the accumulated number of reading of the data to be read, and an elapsed time after the data to be read is written
3. Address information of a page to be read (that is, a physical position of the page to be read (in a case where a memory cell is an MLC, this information can include virtual position information, such as Lower/Upper)
4. Logs of a read process (that may include information whether the read process is hard bit read or soft bit read, information of the method which is used for the soft bit read has been performed in a case of the soft bit read (this information can include information, for example, the number of times of a read process that has been performed for the soft bit read, the presence of an optimum read voltage search process such as Vth-Tracking), for example)
5. Statistical data of an error distribution that has been measured in advance, for example, in screening performed at a time of manufacturing a flash memory chip
6. Statistical data of an error distribution that has been measured dynamically during an operation of a storage device, and the like As a state where a user sets the parameter set to be used, a case can be considered in which bounded distance decoding using the test pattern according to the present embodiment is performed for data (received hard-decision value) read by the hard bit read, for example. In this case, because the soft bit read has not been performed, an LLR of each symbol is not present or becomes a specific value such as '0'. In this case, the user may set the parameter set 43 for the error distribution 3 in FIG. 12 to be used in the decoder 27 through a register or the like, while regarding the variation of the absolute values of the LLRs among the symbols is none.

In addition, it is possible to employ a configuration in which a variance of absolute values of LLRs among symbols in data to be decoded is calculated during an operation and, based on a result of this calculation, one or more of the parameter sets 41 to 43 that is to be used by the decoder 27 is selected. In this case, the decoder 27 may be designed to perform decoding by using the parameter set 43 for the error distribution 3 in FIG. 12 when the calculated variance is a predetermined first threshold or less, perform decoding by using the parameter set 41 for the error distribution 1 in FIG. 12 when the calculated variance is a predetermined second threshold (>the first threshold) or more, and perform decoding by using the parameter set 42 for the error distribution 2 in FIG. 12 when the calculated variance is larger than the first threshold and smaller than the second threshold.

Further, a case is exemplified in the above embodiment, in which the initial value $m_{init}$ of the number of hypothesis errors m is set to be 1, and the number of hypothesis errors m is incremented by 1 when all the variations of the test pattern in which the number of hypothesis errors is m. However, the present invention is not limited to this configuration. For example, it is possible to set a step width by which the number of hypothesis errors m is incremented to be a natural number equal to or larger than 2. Alternately, as exemplified in FIG. 13, it is also possible to employ a configuration in which options of combinations G1, G2, . . . , G11, G12, . . . G31, G32, . . . of numbers that can be set as the number of hypothesis errors m are registered in advance, and any of these options of the combinations G1, G2, . . . , G11, G12, . . . G31, G32, . . . is selected as appropriate. In this case, at Step S5032 in FIG. 10, a top of the number of hypothesis errors m of the selected option of a combination (for example, m=2 when an option of the combination G21 in FIG. 13 is selected) is set. Also, at Step S5039 in FIG. 10, the next number of hypothesis errors m in the selected option of a combination (for example, the next number of hypothesis errors is m=4 when the number of hypothesis errors currently set is m=2 in the option of the combination G21 in FIG. 13).

It may be selected by a user in an arbitrary manner or dynamically selected at a time of decoding which one of the options of the combinations G1, G2, ..., G11, G12, ..., G31, G32, ... exemplified FIG. 13 is used, similarly to the parameter sets 41 to 43 exemplified in FIG. 12. It is possible to determine which one of the options of the combinations G1, G2, ..., G11, G12, ..., G31, G32, ... is used based on various types of conditions, for example, a code used in the encoding/decoding unit 24.

Furthermore, the above embodiment has exemplified a case in which the number of options $r_m$ of symbol position at which an error is assumed is determined based on the symbol number $S_i$ in a symbol arrangement after sorting (see FIG. 11). However, the method of determining the number of options $r_m$ is not limited this configuration. For example, it is possible to determine the number of options $r_m$ at which an error is assumed based on a certainty factor that can be evaluated based on an LLR for each symbol, as illustrated in FIG. 14. FIG. 14 exemplifies a case where when the number of hypothesis errors m is '1', a symbol for which a certainty factor is evaluated as 'low' or 'middle' is set as an option of a symbol position at which an error is assumed. In this case, symbols with symbols numbers $S_0$ to $S_3$ in a symbol arrangement after sorting are set as options as the symbol positions at each of which an error is assumed. FIG. 14 also exemplifies a case where when the number of hypothesis errors m is '1' or '2', the symbol for which the certainty factor is evaluated as 'low' is set as an option of the symbol position at which an error is assumed. In that case, the symbols with the symbol numbers $S_0$ to $S_2$ in the symbol arrangement after sorting are set as options of the symbol positions at each of which an error is assumed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
a memory interface configured to read a received word from a non-volatile memory; and
a decoder configured to:
generate a plurality of test patterns from $$\binom{r_m}{m}$$

variations, where $$\binom{r_m}{m}$$

is a number of combinations of $r_m$ and m,
$r_m$ is a number of options, the options being, among a plurality of symbols forming the received word, symbols that are at positions assumed to be erroneous,
m is a number of objects of rewriting, each being one of the $r_m$ symbols that are the options,
$r_m$ is a natural number equal to or larger than one and indicating the number of the options that is selected when the number of the objects of rewriting is m, and
m is a natural number equal to or larger than one and equal to or smaller than $r_m$,
generate a plurality of test hard-decision values respectively corresponding to the test patterns by rewriting each of hard-decision values of the m symbols that are the objects of rewriting in each of the test patterns among the symbols forming the received word,
perform hard-decision decoding for the received word,
when the hard-decision decoding has been successful, output a result of the hard-decision decoding, and
when the hard-decision decoding has failed, perform bounded distance decoding for each of the test hard-decision values, the bounded distance decoding capable of correcting errors up to a certain symbol number for the read received word.

2. The memory controller according to claim 1, wherein the decoder selects the $r_m$ symbols that are the options based on an error probability of each of the symbols forming the received word.

3. The memory controller according to claim 2, wherein the decoder selects the options in descending order of the error probability of the symbols forming the received word.

4. The memory controller according to claim 1, wherein the decoder outputs a most likely decoded word of a plurality of decoded words obtained by the bounded distance decoding for the respective test hard-decision values.

5. The memory controller according to claim 4, wherein the decoder:
compares each of the decoded words and a hard-decision value of the received word, and
sets a decoded word having a smallest sum of absolute values of log-likelihood ratios of symbols that are different in values between each of the decoded words and the hard-decision value of the received word, as the most likely decoded word.

6. The memory controller according to claim 1, wherein the decoder:
changes m from a first value to a second value, the second value being a natural number equal to or smaller than $r_m$ and being larger than the first value,
generates the test patterns by using each of the first value and the second value,
generates the test hard-decision values for each of the test patterns generated for each of the first value and the second value, and
perform the bounded distance decoding for each of the test hard-decision values generated for each of the test patterns.

7. The memory controller according to claim 6, wherein the decoder:
performs bounded distance decoding for a hard-decision value of the received word, and
determines an initial value of m based on a result of the bounded distance decoding for the hard-decision value.

8. The memory controller according to claim 1, wherein the decoder determines a value of $r_m$ based on at least one of:

environment information that includes at least one of an elapsed time after power of the non-volatile memory is turned on and a temperature around the non-volatile memory, stress information that includes at least one of number of rewriting cycles in a region of the non-volatile memory, from which the received word is read out, an accumulated number of reading times of the received word from the non-volatile memory, and an elapsed time from writing a code word corresponding to the received word to the non-volatile memory, address information of a page to be read in the non-volatile memory, logs of a read process for the non-volatile memory, statistical data of an error distribution measured in advance with regard to the non-volatile memory, and statistical data of an error distribution dynamically measured during an operation of the non-volatile memory.

9. The memory controller according to claim 1, wherein the decoder determines a value of $r_m$ based on a variation of error probabilities of the respective symbols forming the received word.

10. The memory controller according to claim 1, wherein the decoder uses a BCH code or a Reed-Solomon code as an error correcting code with which the bounded distance decoding is performed.

11. A memory system comprising:
the memory controller according to claim 1; and
the non-volatile memory.

12. A memory controller comprising:
a memory interface configured to read out a received word from a non-volatile memory; and
a decoder of an error correcting code that is a binary linear code for which number of values representing '1' present in a code word is an even number, wherein
the decoder is configured to:
when m, which is a natural number equal to or larger than one, satisfies a condition that a remainder after division of m by two is equal to a remainder after division of a sum by two, the sum being a sum of the number of values representing '1' present in hard-decision values of a plurality of symbols forming the received word and the certain symbol number up to which the bounded distance decoding is capable of correcting errors, generate by using m one or more test patterns in which the m number of symbols are objects of rewriting, where each of the objects of rewriting is one of options, the options being, among the symbols forming the received word, symbols that are at positions assumed to be erroneous, $r_m$ is a number of the options, and $r_m$ is a natural number equal to or larger than m and indicating the number of the options that is selected when the number of the objects of rewriting is m, generate one or more test hard-decision values respectively corresponding to the one or more of the test patterns by rewriting hard-decision values of the m symbols that are the objects of rewriting in each of the one or more test patterns, among the symbols forming the received word, perform hard-decision decoding for the received word, when the hard-decision decoding has been successful, output a result of the hard-decision decoding, when the hard-decision decoding has failed, perform bounded distance decoding for each of the test hard-decision values, the bounded distance decoding capable of correcting errors up to a certain symbol number for the read received word, and output a most likely decoded word of a plurality of decoded words obtained by the bounded distance decoding for the respective test hard-decision values.

13. A method for controlling a non-volatile memory, comprising:
reading out a received word from the non-volatile memory;
generating a plurality of test patterns from $$\binom{r_m}{m}$$

variations, where $$\binom{r_m}{m}$$

is number of combinations of $r_m$ and m, $r_m$ is number of options, the options being, among a plurality of symbols forming the received word, symbols that are at positions assumed to be erroneous, m is number of objects of rewriting, each being one of the $r_m$ symbols that are the options, $r_m$ is a natural number equal to or larger than one and indicating the number of the options that is selected when the number of the objects of rewriting is m, m is a natural number equal to or larger than one and equal to or smaller than $r_m$;

generating a plurality of test hard-decision values respectively corresponding to the test patterns by rewriting each of hard-decision values of the m symbols that are the objects of rewriting in each of the test patterns, among the symbols forming the received word;

performing hard-decision decoding for the received word;

when the hard-decision decoding has been successful, outputting a result of the hard-decision decoding; and when the hard-decision decoding has failed, performing bounded distance decoding for each of the test hard-decision values.

14. The method according to claim 13, further comprising determining the $r_m$ symbols that are the options based on an error probability of each of the symbols forming the received word.

15. The method according to claim 14, wherein the determining determines the options in descending order of the error probability of the symbols forming the received word.

16. The method according to claim 14, wherein a value of $r_m$ is determined based on at least one of:

environment information that includes at least one of an elapsed time after power of the non-volatile memory is turned on and a temperature around the non-volatile memory, stress information that includes at least one of number of rewriting cycles in a region of the non-volatile memory, from which the received word is read out, an accumulated number of reading times of the received word from the non-volatile memory, and an elapsed time from writing a code word corresponding to the received word to the non-volatile memory, address information of a page to be read in the non-volatile memory,
logs of a read process for the non-volatile memory,
statistical data of an error distribution measured in advance with regard to the non-volatile memory, and
statistical data of an error distribution dynamically measured during an operation of the non-volatile memory.

17. The method according to claim 13, further comprising outputting a most likely decoded word among a plurality of decoded words obtained by the bounded distance decoding for each of the test hard-decision values.

18. The method according to claim 17, wherein the outputting:
  compares each of the decoded words and a hard-decision value of the received word, and
  outputs a decoded word having a smallest sum of absolute values of a log-likelihood ratio of symbols that are different in values between each of the decoded words and the hard-decision value of the received word, as a decoding result.

19. The method according to claim 13, further comprising changing m from a first value to a second value, the second value being a natural number equal to or smaller than $r_m$ being larger than the first value, wherein
  the generating the test patterns includes generating the test patterns by using each of the first value and the second value,
  the generating the test hard-decision values includes generating the test hard-decision values for each of the first value and the second value, and
  the performing the bounded distance decoding includes performing the bounded distance decoding for each of the test hard-decision values generated for each of the test patterns.

20. The method according to claim 19, further comprising determining an initial value of m based on a result of the bounded distance decoding for a hard-decision value of the received word.

* * * * *